United States Patent
Sakurai

(10) Patent No.: US 10,715,117 B1
(45) Date of Patent: Jul. 14, 2020

(54) COMPARATOR HYSTERESIS CIRCUIT

(71) Applicant: TEXAS INSTRUMENTS INCORPORATED, Dallas, TX (US)

(72) Inventor: Satoshi Sakurai, San Carlos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/544,990

(22) Filed: Aug. 20, 2019

(51) Int. Cl.
*H03K 3/0233* (2006.01)
*H03K 3/3565* (2006.01)

(52) U.S. Cl.
CPC ....... *H03K 3/02337* (2013.01); *H03K 3/3565* (2013.01)

(58) Field of Classification Search
None
See application file for complete search history.

(56) References Cited

U.S. PATENT DOCUMENTS

| | | | |
|---|---|---|---|
| 6,617,883 B1* | 9/2003 | Kuhn | G01R 25/005 327/12 |
| 2018/0219519 A1* | 8/2018 | Schober | H03F 3/3022 |

\* cited by examiner

*Primary Examiner* — Lincoln D Donovan
*Assistant Examiner* — Khareem E Almo
(74) *Attorney, Agent, or Firm* — John R. Pessetto; Charles A. Brill; Frank D. Cimino

(57) ABSTRACT

A comparator circuit includes a first transistor, a second transistor, a first switch, a second switch, and a timing circuit. The first transistor and the second transistor are coupled as a differential pair and are configured to compare an input signal to a hysteresis voltage. The first switch is coupled to the first transistor and is configured to selectably enable the first transistor. The second switch is coupled to the second transistor and is configured to selectably enable the second transistor. The timing circuit is coupled to the first switch and the second switch and is configured to close the first switch responsive to a signal transition at an output of the comparator circuit and close the second switch a predetermined delay time after the first switch is closed.

19 Claims, 6 Drawing Sheets

COMPARATOR HYSTERESIS CIRCUIT

BACKGROUND

A comparator is an electrical circuit device that compares the amplitude of two analog input voltage or current signals and generates an output signal indicating whether one of the two analog input signals has a greater amplitude than the other. In some comparators, the output changes state when the two input signals are substantially equal, which can result in the comparator output toggling between states in response to noise on the input signals. To prevent this problem, some comparators apply hysteresis to provide individual trip thresholds based on the output state, thereby reducing the incidence of noise-induced switching when the voltage levels of the input signals are very dose to one another.

SUMMARY

Comparator circuits that reduce the incidence of output transient glitches caused by switching between different differential pairs based on transition of the comparator output are disclosed herein. In one example, a comparator circuit includes a signal input terminal, an output terminal, a first transistor, a second transistor, a third transistor, a fourth transistor, and a timing circuit. The first transistor includes a first terminal coupled to a first hysteresis voltage circuit. The second transistor includes a first terminal coupled to the signal input terminal, and a second terminal coupled to a second terminal of the first transistor. The third transistor includes a first terminal coupled to a third terminal of the first transistor, and a second terminal coupled to a power rail. The fourth transistor includes a first terminal coupled to a third terminal of the second transistor, and a second terminal coupled to the power rail. The timing circuit includes an input terminal, a first output, a second output, and a delay circuit. The input terminal is coupled to the output terminal. The first output is coupled to a third terminal of the third transistor. The second output is coupled to a third terminal of the fourth transistor. The delay circuit includes an input terminal coupled to the first output and an output terminal coupled to the second output.

In another example, a comparator circuit includes a first transistor, a second transistor, a first switch, a second switch, and a timing circuit. The first transistor and the second transistor are coupled as a differential pair and configured to compare an input signal to a hysteresis voltage. The first switch is coupled to the first transistor and is configured to selectably enable the first transistor. The second switch is coupled to the second transistor and is configured to selectably enable the second transistor. The timing circuit is coupled to the first switch and the second switch and configured to close the first switch responsive to a signal transition at an output of the comparator circuit and close the second switch a predetermined delay time after the first switch is closed.

In a further example, a comparator circuit includes a signal input terminal, an output terminal, a first input circuit, a second input circuit, and a timing circuit. The first input circuit includes a first transistor, a second transistor, a third transistor, and a fourth transistor. The first transistor comprising a first terminal coupled to a first hysteresis voltage circuit. The second transistor includes a first terminal coupled to the signal input terminal, and a second terminal coupled to a second terminal of the first transistor. The third transistor includes a first terminal coupled to a third terminal of the first transistor, and a second terminal coupled to a power rail. The fourth transistor includes a first terminal coupled to a third terminal of the second transistor, and a second terminal coupled to the power rail. The second input circuit includes a fifth transistor, a sixth transistor, a seventh transistor, and an eighth transistor. The fifth transistor includes a first terminal coupled to a second hysteresis voltage circuit. The sixth transistor includes a first terminal coupled to the signal input terminal, and a second terminal coupled to a second terminal of the fifth transistor. The seventh transistor includes a first terminal coupled to a third terminal of the fifth transistor, and a second terminal coupled to the power rail. The eighth transistor includes a first terminal coupled to a third terminal of the sixth transistor, and a second terminal coupled to the power rail. The timing circuit includes an input terminal, a first output, a second output, a third output, and a fourth output. The input terminal is coupled to the output terminal. The first output is coupled to a third terminal of the third transistor. The second output is coupled to a third terminal of the fourth transistor. The third output is coupled to a third terminal of the seventh transistor. The fourth output is coupled to a third terminal of the eighth transistor.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Many comparators apply hysteresis to reject noise on the input signal. the accuracy of the hysteresis applied across comparators varies widely. For example, in some comparators, the hysteresis voltage may vary by up to 50%. Some comparators that provide accurate hysteresis generate the hysteresis using two differential pairs, with each differential pair connected to a different reference voltage.

Figure 1:
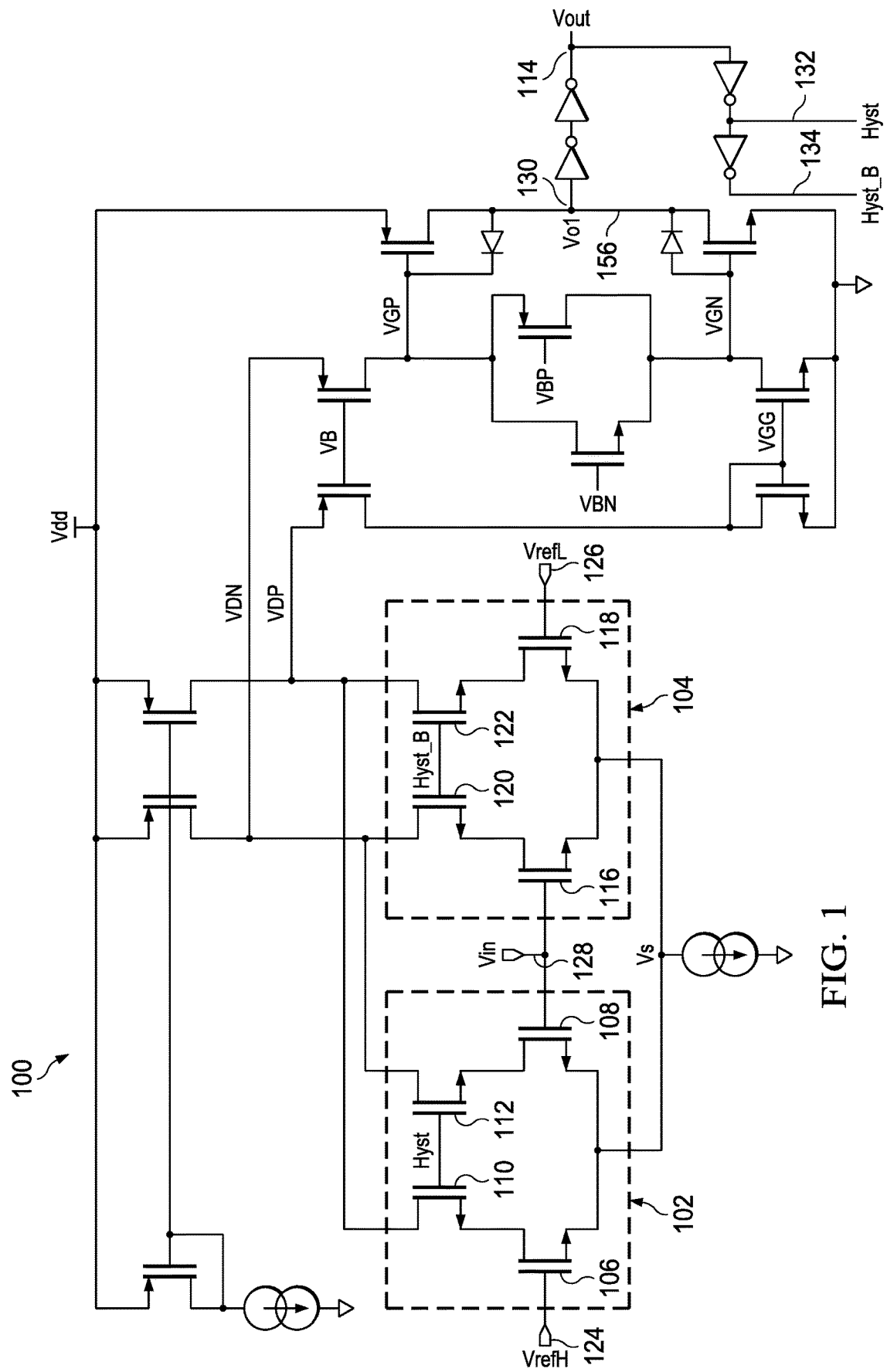
FIG. 1 shows a schematic diagram for an example comparator circuit that provides accurate hysteresis using two input circuits.

FIG. 1 shows a schematic diagram for an example comparator circuit 100 that provides accurate hysteresis using two input circuits. The comparator circuit 100 includes an input circuit 102 and an input circuit 104. The input circuit 102 includes transistors 106 and 108 that form a differential pair, and transistors 110 and 112 that act as switches to enable or disable the differential pair. Similarly, the input circuit 104 includes transistors 116 and 118 that form a differential pair, and transistors 120 and 122 that act as switches to enable or disable the differential pair. If the voltage at the output terminal 114 of the comparator circuit 100 is a logic "low," the input circuit 102 is enabled to compare the input signal 128 to the high hysteresis voltage 124, and when the input signal 128 is greater than the high hysteresis voltage 124 the output of the comparator circuit 100 will change to a logic "high." If the voltage at the output terminal output terminal 114 of the comparator circuit 100 is a logic "high," the input circuit 104 is enabled to compare the input signal 128 to the low hysteresis voltage 126, and when the input signal 128 is less than the low hysteresis voltage 126 the output of the comparator circuit 100 with change to a logic "low." Thus, the hysteresis applied in the comparator circuit 100 is precisely determined by the difference of the high hysteresis voltage 124 and the low hysteresis voltage 126.

When the input signal 128 is slowly decreasing, and crosses, for example, the low hysteresis voltage 126, the voltage at the output node 130 will also be changing slowly. However, the control signals 132 and 134 will change quickly to disable the input circuit 104 and enable the input circuit 102. As the input circuit 102 is enabled, parasitic capacitors at the drains of the transistor 106 and the transistor 108 are charged, which induces common mode current flow in the transistor 110 and the transistor 112, and in turn causes voltage at the drains of the transistor 110 and the transistor 112 to drop. Because the signal path from the drain of the transistor 112 to the output node 130 is shorter than the signal path from the drain of the transistor 110 to the output node 130, the voltage at the output node 130 will momentarily increase, and possibly cause a transient glitch on the output terminal 114.

Some implementations of the comparator circuit 100 match the signal paths from drains of the transistor 110, the transistor 112, the transistor 120 and the transistor 122 to the output node 130 to cancel the effects of the parasitic capacitor charging currents. However, matching the timings of these paths is difficult, and even if the timings are matched, differences in the parasitic capacitances at the drain terminals of the transistor 106, the transistor 108, the transistor 116, and the transistor 118 may produce a timing difference sufficient to cause a transient glitch at the output terminal 114.

Figure 2A:
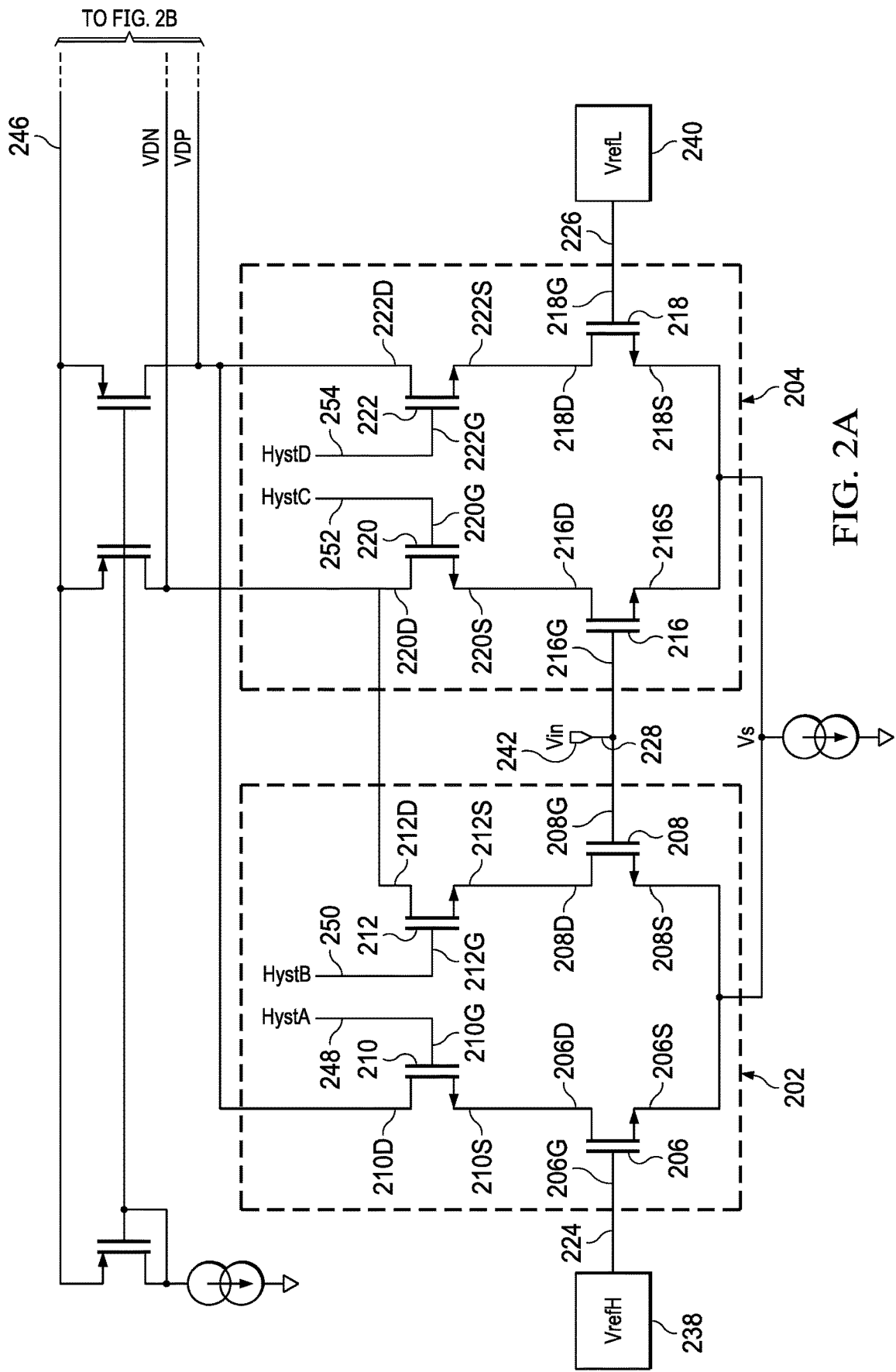
FIGS. 2A and 2B show a schematic diagram for an example comparator circuit that provides accurate hysteresis while reducing output transient glitches when switching between two input circuits.
Figure 2B:
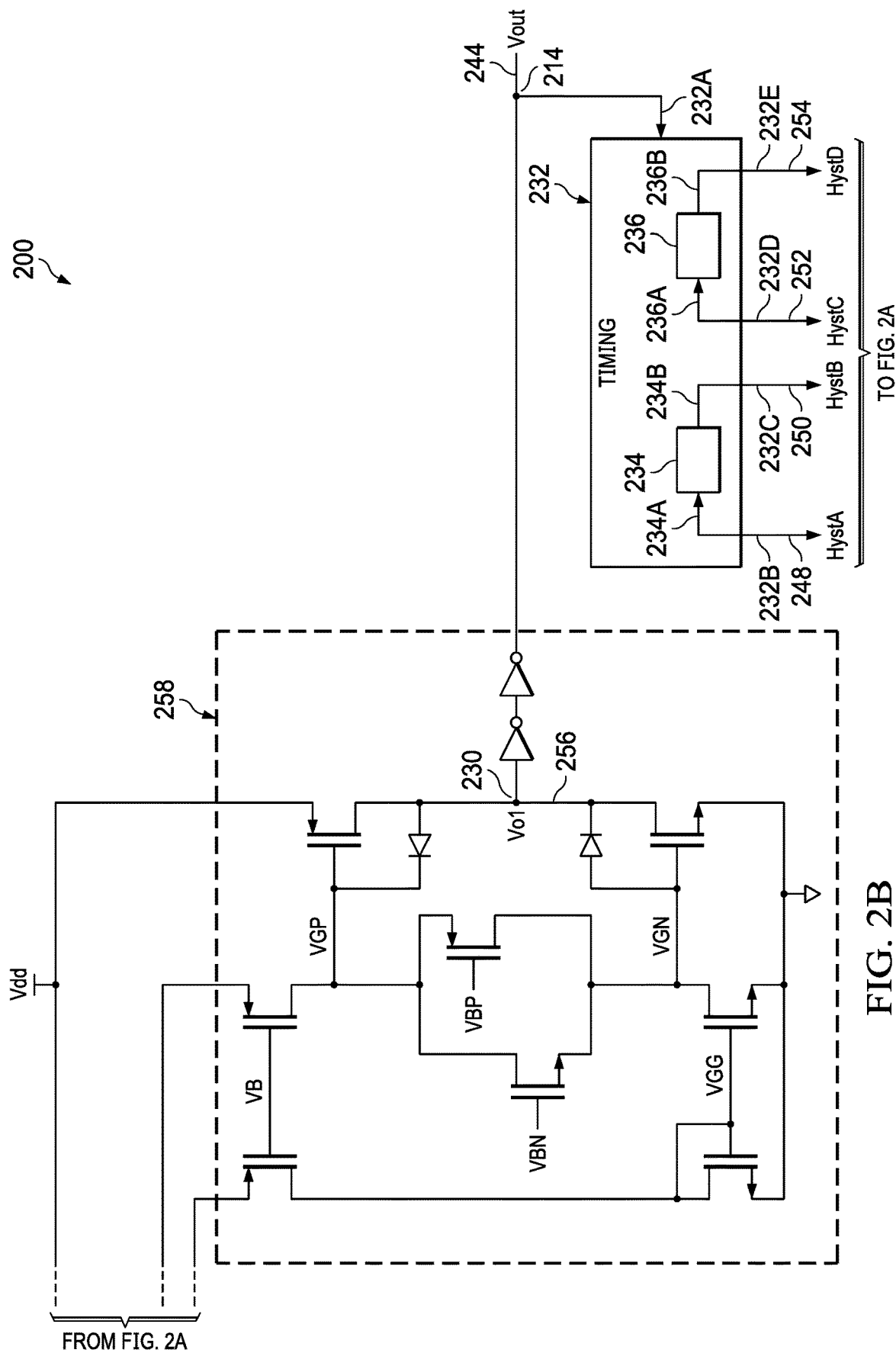

FIGS. 2A and 2B show a schematic diagram for an example comparator circuit 200 that provides accurate hysteresis while reducing output transient glitches when switching between two input circuits. Rather than attempting to match path timing, the comparator circuit 200 controls the enable timing of the differential pairs to reduce or eliminate transient glitches at the comparator output. The comparator circuit 200 includes an input circuit 202, an input circuit 204, a signal input terminal 242, an output terminal 214, output circuitry 258, and a timing circuit 232. The input circuit 202 includes transistors 206 and 208 that form a differential pair, and transistors 210 and 212 that act as switches to enable or disable the differential pair. The source terminal 206S of the transistor 206 is coupled to the source terminal 208S of the transistor 208. The gate terminal 206G of the transistor 206 is coupled to the hysteresis voltage circuit 238 that generates the hysteresis voltage 224. The hysteresis voltage 224 sets the threshold for transitioning from logic "low" to logic "high." The drain terminal 206D of the transistor 206 is coupled to the source terminal 210S of the transistor 210. The drain terminal 210D of the transistor 210 is coupled to the power rail 246 and the output circuitry 258.

The gate terminal 208G of the transistor 208 is coupled to the signal input terminal 242 for receipt of the input signal 228 for comparison to the hysteresis voltage 224. The drain terminal 208D of the transistor 208 is coupled to the source terminal 212S of the transistor 212. The drain terminal 212D of the transistor 212 is coupled to the power rail 246 and the output circuitry 258.

The input circuit 204 includes transistors 216 and 218 that form a differential pair, and transistors 220 and 222 that act as switches to enable or disable the differential pair. The source terminal 216S of the transistor 216 is coupled to the source terminal 218S of the transistor 218. The gate terminal 216G of the transistor 216 is coupled to the signal input terminal 242 for receipt of the input signal 228. The drain terminal 216D of the transistor 216 is coupled to the source terminal 220S of the transistor 220. The drain terminal 220D of the transistor 220 is coupled to the 212D of the transistor 212, the power rail 246 and the output circuitry 258.

The gate terminal 218G of the transistor 218 is coupled to the hysteresis voltage circuit 240 that generates the hysteresis voltage 226 for comparison to the input signal 228. The drain terminal 218D of the transistor 218 is coupled to the source terminal 222S of the transistor 222. The drain terminal 222D of the transistor 222 is coupled to the 210D of the transistor 210, the power rail 246, and the output circuitry 258.

The timing circuit 232 includes an input terminal 232A coupled to the output terminal 214, an output 232B coupled to the input terminal 232A, an output 232C coupled to the input terminal 232A, a delay circuit 234, and a delay circuit 236. The delay circuit 234 includes an input terminal 234A coupled to the output 232B and an output terminal 234B coupled to an output 232C of the timing circuit 232. The delay circuit 236 includes an input terminal 236A coupled to the output 232D of the timing circuit 232 and an output terminal 236B coupled to the output 232E of the timing circuit 232. The output 232B of the timing circuit 232 is coupled to the gate terminal 210G of the transistor 210. The output 232C of the timing circuit 232 is coupled to the gate terminal 212G of the transistor 212. The output 232D of the timing circuit 232 is coupled to the gate terminal 220G of the transistor 220. The output 232E of the timing circuit 232 is coupled to the gate terminal 222G of the transistor 222.

The timing circuit 232 sequences the turning on and off of each of the transistor 210, the transistor 212, the transistor 220, and transistor 222 at each transition of the comparator output signal 244 to inhibit transient glitches at the output terminal 214. The timing circuit 232 delays the turn on of the transistor 212 relative to the transistor 210 and delays the turn on of the transistor 222 relative to the transistor 220. The delay provided by the delay circuit 234 and the delay circuit 236 operates as time domain hysteresis to prevent transient glitches at the output terminal 214. The delay time provided by the delay circuit 234 is at least as great as the difference in propagation delay from the drain terminal 210D of the transistor 210 and the drain terminal 212D of the transistor 212 to the output node 230. Similarly, the delay time provided by the delay circuit 236 is at least as great as the difference in propagation delay from the drain terminal 220D of the transistor 220 and the drain terminal 222D of the transistor 222 to the output node 230. The delay ensures that the signal in the longer path reaches the output node 230 no later than the signal in the shorter path.

Figure 3:
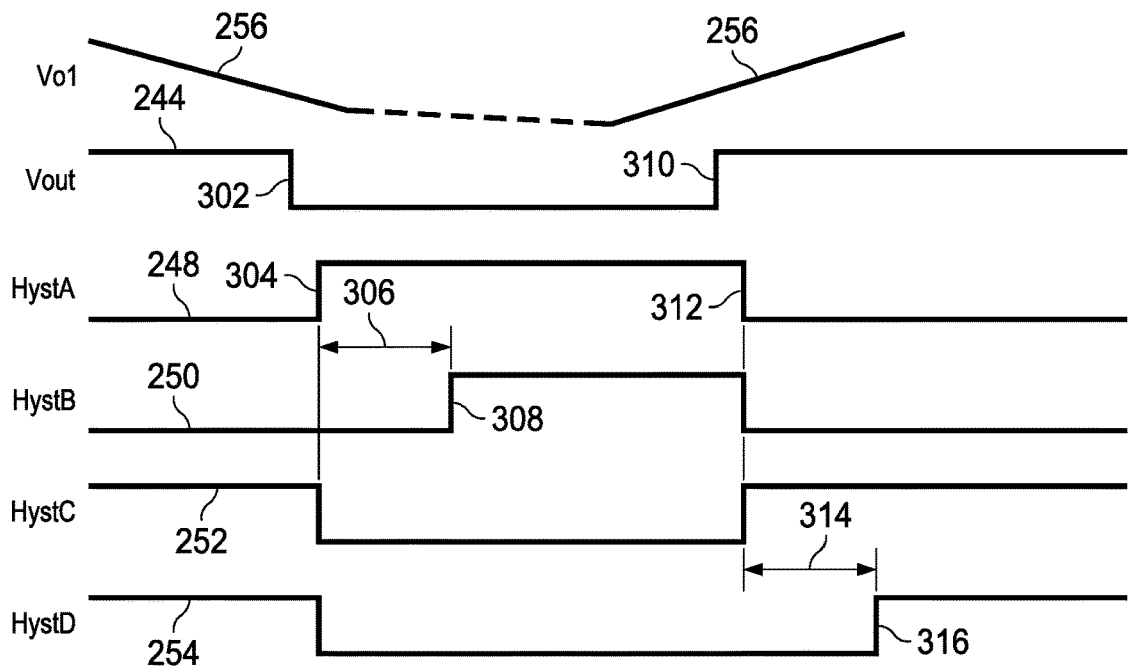
FIG. 3 shows example signals generated in the comparator circuit of FIGS. 2A and 2B.

FIG. 3 shows example signals generated in the comparator circuit 200. As the voltage 256 at the output node 230 slowly falls, the comparator output signal 244 (Vout) switches from logic "high" to logic "low" at 302. Shortly thereafter, at time 304, the timing circuit 232 activates the control signal 248 (HystA) to turn on the transistor 210 and deactivates the control signal 252 (HystC) and the control signal 254 (HystD) to turn off the transistor 220 and the transistor 222. After delay 306, the timing circuit 232 activates the control signal 250 (HystB) to turn on the transistor 212.

As the voltage 256 at the output node 230 slowly rises, the comparator output signal 244 (Vout) switches from logic "low" to logic "high" at 310. Shortly thereafter, at time 312, the timing circuit 232 activates the control signal 252 (HystC) to turn on the transistor 220 and deactivates the control signal 248 (HystA) and the control signal 250 (HystB) to turn off the transistor 210 and the transistor 212. After delay 314, the timing circuit 232 activates the control signal 254 (HystD) to turn on the transistor 222.

Figure 4A:
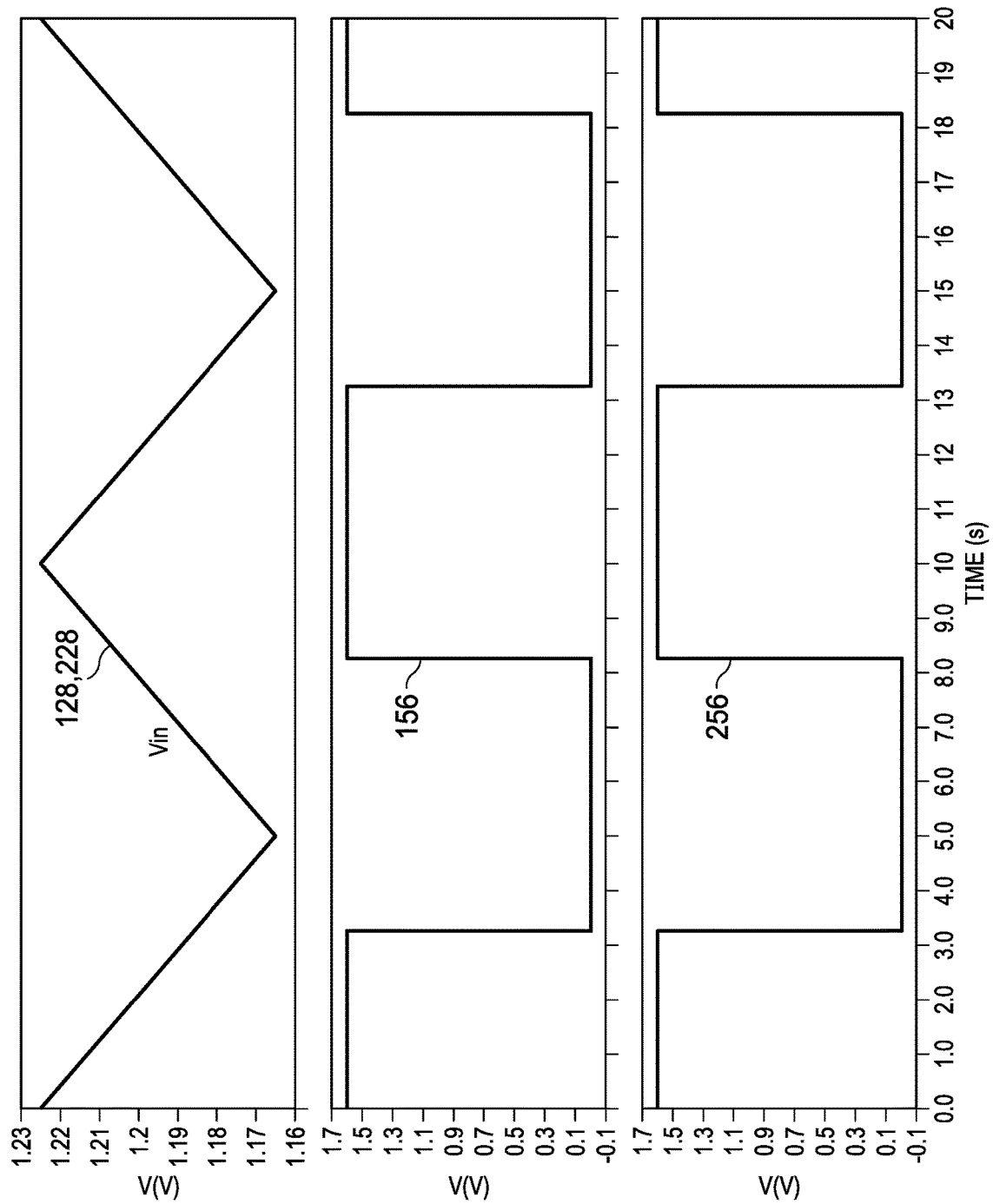
FIGS. 4A and 4B show a comparison of output signals generated by the comparator circuit of FIG. 1 and the comparator circuit of FIGS. 2A and 2B.
Figure 4B:
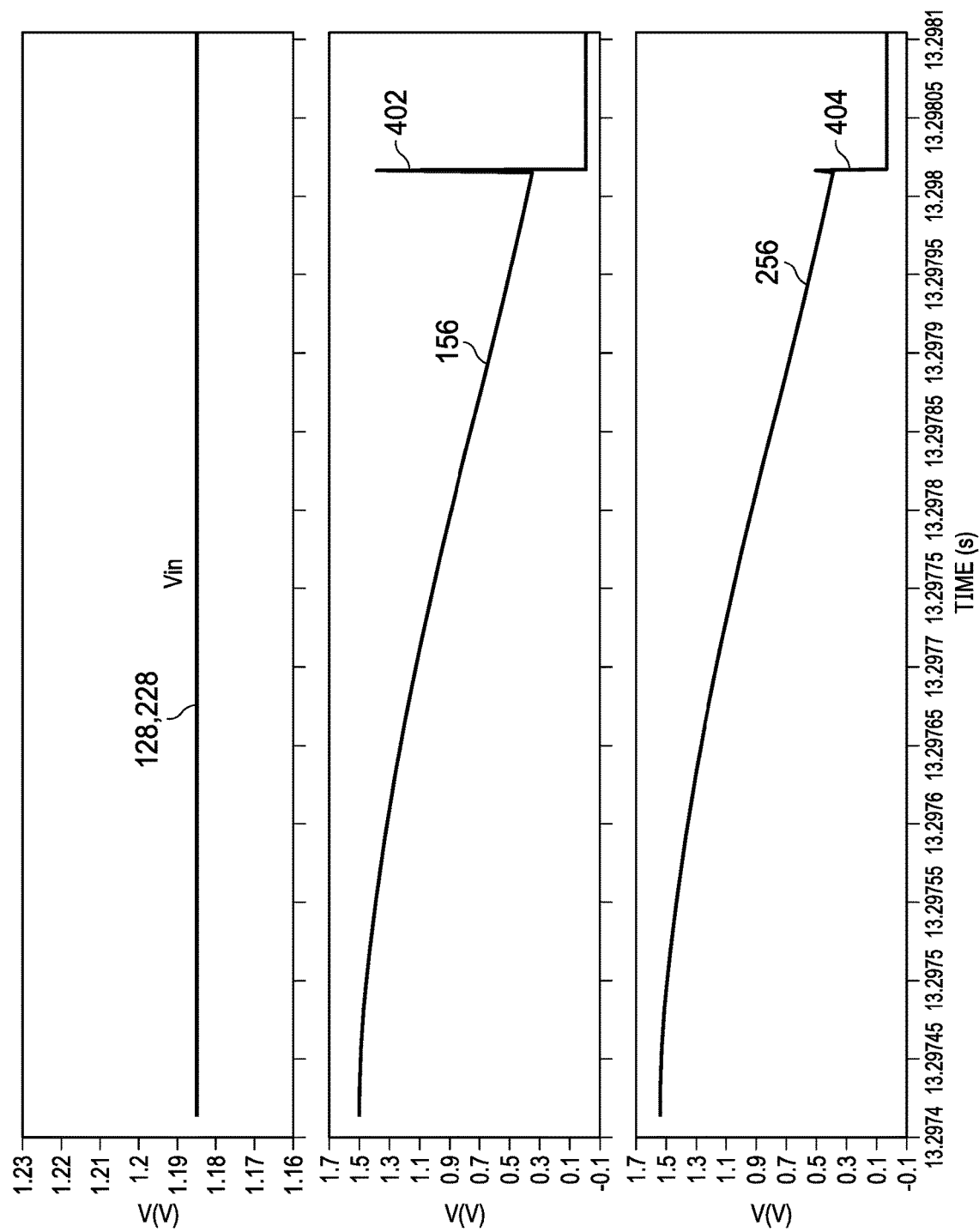

FIGS. 4A and 4B show a comparison of output signals generated by the comparator circuit 100 and the comparator circuit 200. FIG. 4A shows the input signal 128 and input signal 228 as a slowly changing triangular ramp. The voltage 156 at the output node 130 of the comparator circuit 100 and the voltage 256 at the output node 230 of the comparator circuit 200 toggle as the input signal 128 rises and falls. At the time scale of FIG. 4A transient glitches are not visible at the edges of the voltage 156 or the voltage 256. FIG. 4B shows a falling edge of the voltage 156 and the voltage 256 at a much higher time scale. As the voltage 156 falls, a transient glitch 402 is caused by the difference in path delay from the transistor 120 and the transistor 122. The transient glitch may trigger a change in the logical signal level at the output terminal 114. As the voltage 256 falls, a much smaller transient glitch 404 is generated. The level of the transient glitch 404 is insufficient to trigger a change in the logic level of the comparator output signal 244.

Figure 5A:
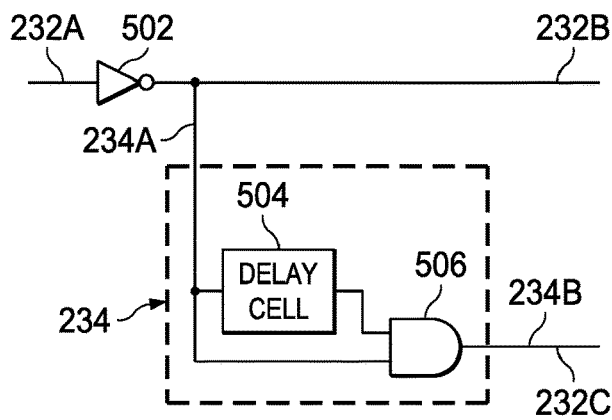
FIGS. 5A and 5B show examples of delay circuitry in the timer circuit provided in the comparator circuit of FIGS. 2A and 2B.
Figure 5B:
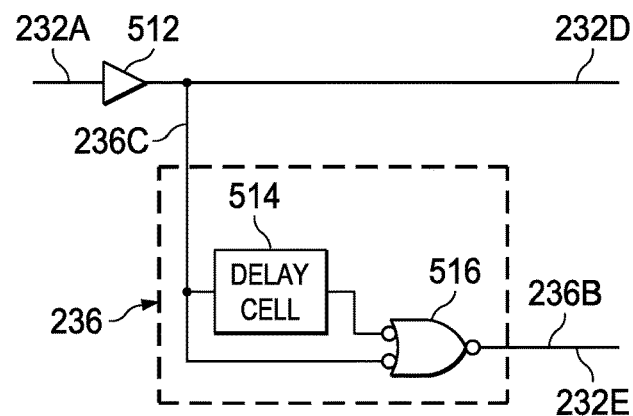

FIGS. 5A and 5B show examples of circuitry in the timing circuit 232 of the comparator circuit 200. FIG. 5A shows example circuitry for generating the control signal 248 (HystA) and the control signal 250 (HystB). An inverter 502 coupled to the input terminal 232A and the output 232B generates the control signal 248. The delay circuit 234 includes a delay cell 504 and an AND gate 506. The delay cell 504 delays the output of the inverter 502 by the delay 306, and the AND gate 506 combines the output of the inverter 502 and the output of the delay cell 504 to produce the control signal 250. The delay cell 504 may include any number of delay elements (e.g., inverters) needed to produce the delay 306.

FIG. 5B shows example circuitry for generating the control signal 252 (HystC) and the control signal 254 (HystD). A non-inverting buffer 512 coupled to the input terminal 232A and the output 232D generates the control signal 252. The delay circuit 236 includes a delay cell 514 and an AND gate 516. The delay cell 514 delays the output of the non-inverting buffer 512 by the delay 314, and the AND gate 516 combines the output of the non-inverting buffer 512 and the output of the delay cell 514 to produce the control signal 254. The delay cell 514 may include any number of delay elements (e.g., inverters) needed to produce the delay 314.

Modifications are possible in the described embodiments, and other embodiments are possible, within the scope of the claims.

What is claimed is:

1. A comparator circuit, comprising:
   a signal input terminal;
   an output terminal;
   a first transistor comprising a first terminal coupled to a first hysteresis voltage circuit;
   a second transistor, comprising:
     a first terminal coupled to the signal input terminal; and
     a second terminal coupled to a second terminal of the first transistor;
   a third transistor, comprising:
     a first terminal coupled to a third terminal of the first transistor; and
     a second terminal coupled to a power rail;
   a fourth transistor, comprising:
     a first terminal coupled to a third terminal of the second transistor; and
     a second terminal coupled to the power rail; and
   a timing circuit, comprising:
     an input terminal coupled to the output terminal;
     a first output coupled to a third terminal of the third transistor;
     a second output coupled to a third terminal of the fourth transistor; and
     a delay circuit, comprising:
       an input terminal coupled to the first output; and
       an output terminal coupled to the second output;
   further comprising:
   a fifth transistor, comprising:
     a first terminal coupled to the second terminal of the fourth transistor; and
     a second terminal coupled to a third output of the timing circuit.

2. The comparator circuit of claim 1, wherein the third output of the timing circuit is coupled to the input terminal of the timing circuit.

3. The comparator circuit of claim 1, further comprising:
   a sixth transistor comprising:
     a first terminal coupled to the signal input terminal;
     a second terminal coupled to the second terminal of the first transistor; and
     a third terminal coupled to a third terminal of the fifth transistor.

4. The comparator circuit of claim 1, further comprising:
   a sixth transistor, comprising:
     a first terminal coupled to the second terminal of the third transistor; and
     a second terminal coupled to a fourth output of the timing circuit.

5. The comparator circuit of claim 4, further comprising:
   a seventh transistor comprising:
     a first terminal coupled to a second hysteresis voltage circuit; and
     a second terminal coupled to the second terminal of the first transistor; and
     a third terminal coupled to a third terminal of the sixth transistor.

6. The comparator circuit of claim 4, wherein:
   the delay circuit is a first delay circuit; and
   the timing circuit comprises a second delay circuit comprising:
     an input terminal coupled to the third output; and
     an output terminal coupled to the fourth output.

7. A comparator circuit, comprising:
   a first transistor and a second transistor coupled as a differential pair, and configured to compare an input signal to a hysteresis voltage;
   a first switch coupled to the first transistor, and configured to selectably enable the first transistor;

a second switch coupled to the second transistor, and configured to selectably enable the second transistor;
a timing circuit coupled to the first switch and the second switch, and configured to:
close the first switch responsive to a signal transition at an output terminal of the comparator circuit; and
close the second switch a predetermined delay time after the first switch is closed.

8. The comparator circuit of claim 7, wherein:
the signal transition is a first signal transition; and
the timing circuit is configured to open the first switch and the second switch responsive to a second signal transition at the output terminal of the comparator circuit.

9. The comparator circuit of claim 8, wherein the timing circuit is configured to open the first switch and the second switch with no predetermined delay between opening of the first switch and opening of the second switch.

10. The comparator circuit of claim 7, wherein:
the hysteresis voltage is a first hysteresis voltage;
the comparator circuit further comprises:
a third transistor and a fourth transistor coupled as a differential pair, and configured to compare the input signal to a second hysteresis voltage;
a third switch coupled to the third transistor, and configured to selectably enable the third transistor;
a fourth switch coupled to the fourth transistor, and configured to selectably enable the fourth transistor; and
the timing circuit is coupled to the third switch and the fourth switch and is configured to open the third switch and the fourth switch responsive to the signal transition at the output terminal of the comparator circuit.

11. The comparator circuit of claim 10, wherein the timing circuit is configured to open the third switch and the fourth switch with no predetermined delay between opening of the third switch and opening of the fourth switch.

12. The comparator circuit of claim 10, wherein:
the signal transition is a first signal transition; and
the timing circuit is configured to:
close the third switch responsive to a second signal transition at the output terminal of the comparator circuit; and
close the fourth switch the predetermined delay time after the third switch is closed.

13. The comparator circuit of claim 7, further comprising output circuitry coupled to the first switch and the second switch; wherein the predetermined delay time is at least a long as a difference of propagation delay from the first switch through the output circuitry and propagation delay from the second switch through the output circuitry.

14. A comparator circuit, comprising:
a signal input terminal;
an output terminal;
a first input circuit, comprising:
a first transistor comprising a first terminal coupled to a first hysteresis voltage circuit;
a second transistor, comprising:
a first terminal coupled to the signal input terminal; and
a second terminal coupled to a second terminal of the first transistor;
a third transistor, comprising:
a first terminal coupled to a third terminal of the first transistor; and
a second terminal coupled to a power rail; and a fourth transistor, comprising:
a first terminal coupled to a third terminal of the second transistor; and
a second terminal coupled to the power rail;
a second input circuit, comprising:
a fifth transistor comprising a first terminal coupled to a second hysteresis voltage circuit;
a sixth transistor, comprising:
a first terminal coupled to the signal input terminal; and
a second terminal coupled to a second terminal of the fifth transistor;
a seventh transistor, comprising:
a first terminal coupled to a third terminal of the fifth transistor; and
a second terminal coupled to the power rail; and
an eighth transistor, comprising:
a first terminal coupled to a third terminal of the sixth transistor; and
a second terminal coupled to the power rail; and
a timing circuit, comprising:
an input terminal coupled to the output terminal;
a first output coupled to a third terminal of the third transistor;
a second output coupled to a third terminal of the fourth transistor;
a third output coupled to a third terminal of the seventh transistor; and
a fourth output coupled to a third terminal of the eighth transistor.

15. The comparator circuit of claim 14, wherein the timing circuit comprises a delay circuit comprising:
an input terminal coupled to the first output; and
an output terminal coupled to the second output.

16. The comparator circuit of claim 15, further comprising output circuitry coupled to the third transistor and the fourth transistor, wherein the delay circuit is configured to provide between the first output and the second output a delay that is at least a long as a difference of propagation delay from the third transistor through the output circuitry and propagation delay from the fourth transistor through the output circuitry.

17. The comparator circuit of claim 14, wherein the timing circuit comprises a delay circuit, comprising:
an input terminal coupled to the fourth output; and
an output terminal coupled to the third output.

18. The comparator circuit of claim 14, wherein the timing circuit is configured to:
responsive to a signal transition at the output terminal:
turn off the seventh transistor and the eighth transistor;
turn on the third transistor; and
turn on the fourth transistor a predetermined delay time after the third transistor is turned on.

19. The comparator circuit of claim 18, wherein:
the signal transition is a first signal transition; and
the timing circuit is configured to:
responsive to a second signal transition at the output terminal:
turn off the third transistor and the fourth transistor;
turn on the seventh transistor responsive to the signal transition; and
turn on the eighth transistor a predetermined delay time after the seventh transistor is turned on.

* * * * *